United States Patent
Bosman

(10) Patent No.: US 12,290,879 B2
(45) Date of Patent: May 6, 2025

(54) METHOD FOR CREATING SHUNT FREE TRANSLUCENT FLEXIBLE THIN-FILM PHOTOVOLTAIC MODULE

(71) Applicant: Nederlandse Organisatie voor toegepast-natuurwetenschappelijk Onderzoek TNO, 's-Gravenhage (NL)

(72) Inventor: Johan Bosman, Petten (NL)

(73) Assignee: Nederlandse Organisatie voor toegepast-natuurwetenschappelijk Onderzoek TNO, s'-Gravenhage (NL)

( * ) Notice: Subject to any disclaimer, the term of this patent is extended or adjusted under 35 U.S.C. 154(b) by 383 days.

(21) Appl. No.: 17/774,864

(22) PCT Filed: Nov. 12, 2020

(86) PCT No.: PCT/EP2020/081959
§ 371 (c)(1),
(2) Date: May 6, 2022

(87) PCT Pub. No.: WO2021/094481
PCT Pub. Date: May 20, 2021

(65) Prior Publication Data
US 2022/0388097 A1    Dec. 8, 2022

(30) Foreign Application Priority Data

Nov. 13, 2019    (EP) ..................................... 19208958

(51) Int. Cl.
*B23K 26/364*    (2014.01)
*B23K 26/0622*    (2014.01)
(Continued)

(52) U.S. Cl.
CPC ........ *B23K 26/364* (2015.10); *B23K 26/0624* (2015.10); *B23K 26/082* (2015.10);
(Continued)

(58) Field of Classification Search
CPC .............. B23K 26/364; B23K 26/0624; B23K 26/082; B23K 26/083; B23K 26/402;
(Continued)

(56) References Cited

U.S. PATENT DOCUMENTS

| 8,399,281 B1 | 3/2013 | Patterson et al. |
| 2010/0195039 A1* | 8/2010 | Park ...................... G02F 1/1333 445/24 |

(Continued)

FOREIGN PATENT DOCUMENTS

| DE | 102011012275 A1 | 8/2012 |
| JP | 2003151921 A | 5/2003 |
| JP | 2005236017 A | 9/2005 |

*Primary Examiner* — Douglas W Owens
(74) *Attorney, Agent, or Firm* — N.V. Nederlandsch Octrooibureau

(57) ABSTRACT

A method for shaping a thin-film photovoltaic cell module from a photovoltaic cell sheet according to a predetermined contour of the module, where the cell sheet includes a flexible substrate based on a polymer or metal foil and a photovoltaic stack including one or more photo-active layers arranged on a front surface of the substrate. The method includes: providing the cell sheet, directing a laser beam towards a rear surface of the substrate; creating, by the laser beam, a trench in the rear surface, the trench shaped according to the contour such that the cell sheet is "divided" in a first portion within the contour and a second portion outside the contour; affixing a handling tool to one of the portions of the cell sheet on the rear surface of the substrate; selectively separating the portions by displacing the handling tool and one portion relative to the other portion.

15 Claims, 3 Drawing Sheets

(51) Int. Cl.
*B23K 26/08* (2014.01)
*B23K 26/082* (2014.01)
*B23K 26/402* (2014.01)
*B23K 101/36* (2006.01)
*B23K 103/00* (2006.01)
*B23K 103/16* (2006.01)
*H01L 31/18* (2006.01)

(52) U.S. Cl.
CPC .......... *B23K 26/083* (2013.01); *B23K 26/402* (2013.01); *H01L 31/18* (2013.01); *B23K 2101/36* (2018.08); *B23K 2103/172* (2018.08); *B23K 2103/42* (2018.08)

(58) Field of Classification Search
CPC .......... B23K 2101/36; B23K 2103/172; B23K 2103/42; H01L 31/18; H01L 21/78
See application file for complete search history.

(56) References Cited

U.S. PATENT DOCUMENTS

| | | |
|---|---|---|
| 2011/0124147 A1 | 5/2011 | Mayerhofer |
| 2017/0301822 A1 | 10/2017 | Gibson et al. |
| 2018/0006183 A1 | 1/2018 | Chen et al. |

\* cited by examiner

METHOD FOR CREATING SHUNT FREE TRANSLUCENT FLEXIBLE THIN-FILM PHOTOVOLTAIC MODULE

TECHNICAL FIELD

The present invention relates to a method for shaping a thin-film photovoltaic cell module from a photovoltaic cell sheet in accordance with a predetermined contour of the module. Also, the invention relates to a thin-film photovoltaic cell module.

BACKGROUND

Thin-film flexible photovoltaic modules are typically manufactured by creating a photovoltaic cell sheet consisting of a photovoltaic layer stack on a flexible carrier or flexible substrate. Within the photovoltaic layer photovoltaic cells or solar cells are formed by creating patterns of insulating structures and via structures by insulation scribes and via scribes filled with conductive material. Also a conductive grid can be formed on a top surface of the patterned photovoltaic cell layer.

Under circumstances, photovoltaic cells or parts thereof are selectively removed from the substrate by a mechanical or optical cutting operation to create a layout of the photovoltaic module with a predetermined shape.

However, it is known that such selective removal may result in an undesirable colour of the now visible portion of the flexible carrier of the module, due to the original colour of the carrier or due to a discoloration caused by the removal process. Also, the mechanical or optical cutting operation may cause damage to the photovoltaic layer and/or the conductive top electrode which results in shunting of the photovoltaic cell.

To avoid this, mechanical punching or die cutting can be used to remove the visible portion of the carrier or alternatively to remove the full photovoltaic layer stack including the carrier, but require that the photovoltaic layer and top transparent conductor layer are encapsulated, preceding these processes. Also a new encapsulation must be carried out afterwards to cover the surfaces that were cut away by the mechanical punching or die cutting.

Alternatively, a flexible carrier that is colourless can be used at higher cost or a removal process can be used with less discoloration effect at the cost of a lower efficiency of removing (material of) the photovoltaic cells.

It is an object of the present invention to provide an alternative or enhanced process to create a layout of the photovoltaic module.

SUMMARY OF THE INVENTION

The object is achieved by a method for shaping a thin-film photovoltaic cell module from a photovoltaic cell sheet in accordance with a predetermined contour of the module, the photovoltaic cell sheet comprising a flexible substrate and a photovoltaic stack comprising one or more photoactive layers arranged on a front surface of the substrate in accordance with appended claim 1.

Typically the flexible substrate is a polymer foil or a metal foil covered with an insulating coating.

Advantageously, the creation of the trench in such a flexible substrate of the photovoltaic cell sheet and which acts as a cutting line provides that locally the substrate becomes mechanically weakened and enables removal of the photovoltaic stack including the substrate from the rear side of the substrate. The handling tool is affixed on the rear surface of the substrate to the portion of photovoltaic cell sheet that needs to be removed. By displacing (or lifting) the tool relative to the remaining portion, rupture of the flexible substrate at the location of the created trenches takes place and the affixed portion of the photovoltaic cell sheet separates from the remaining portion.

By creating the trenches from the rear surface of the substrate and to a predetermined depth smaller than the thickness of the substrate, the photovoltaic layer stack is not affected by the laser. Also no discoloration visible from the front surface is created by the laser beam, and damage causing shunting can be avoided.

The selective removal of both the photovoltaic layer stack and the substrate by this method also avoids that areas of transparent substrate which may have a distinct undesirable colour are created or left behind.

Moreover, the invention allows to create free formed solar cells due to the possibility to create curved cutting lines and to the mechanical properties of the flexible polymer or metal foil.

Finally, the separation of the first and second portions can be done preceding an encapsulation of the photovoltaic module, thus without an increase of encapsulation processing steps.

BRIEF DESCRIPTION OF DRAWINGS

The present invention will be described hereinafter, by way of example only, with reference to the accompanying drawings in which illustrative embodiments of the invention are shown.

In the drawings, identical or similar elements are indicated by the same reference sign.

DETAILED DESCRIPTION OF EMBODIMENTS

Figure 1A:
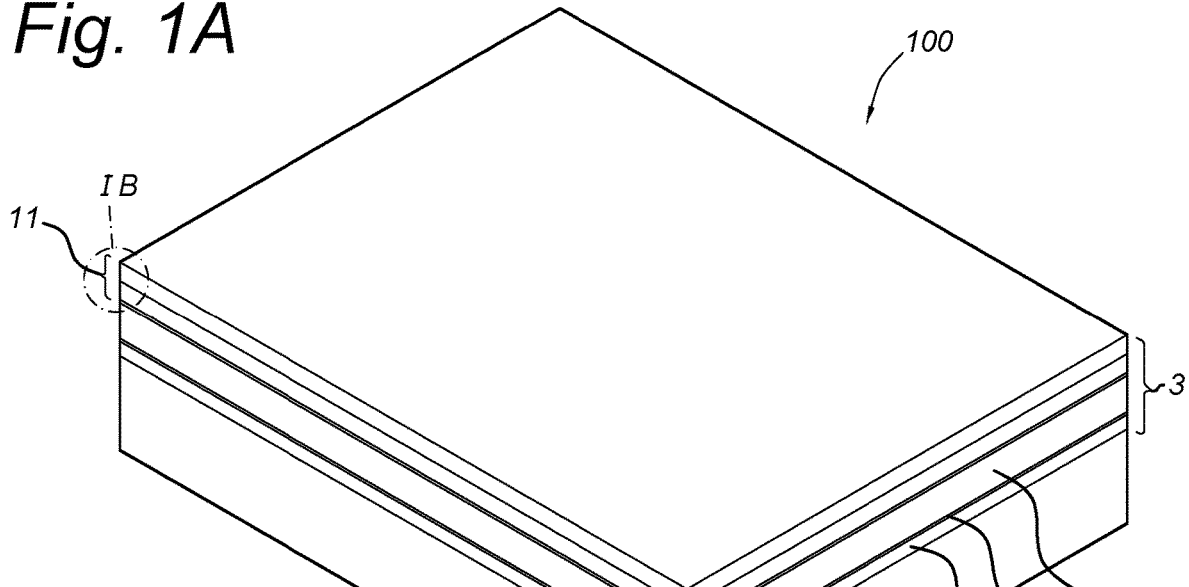
FIG. 1 schematically shows a perspective view of a photovoltaic cell sheet.
Figure 1B:
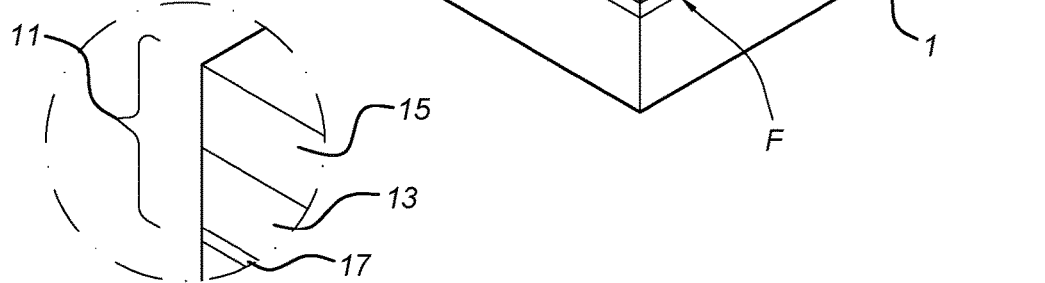

FIG. 1 schematically shows a perspective view of a photovoltaic cell sheet 100.

As an example a photovoltaic cell sheet 100 based on CIGS (copper indium gallium (di-) selenide) as photovoltaic active layer which is deposited on a foil or flexible substrate or carrier is shown to illustrate the invention. For example, such a photovoltaic cell sheet can be manufactured in a roll-to-roll process as known in the art.

It will be appreciated that the method according to the invention can be implemented also for photovoltaic cell sheets on flexible substrate that are based on other photovoltaic layer stacks that apply different photovoltaic active layers, such perovskite, a combination of CIGS and perovskite, organic photovoltaic (OPV), amorphous thin-film silicon and other thin-film PV concepts.

According to an embodiment, the CIGS based cell sheet 100 comprises a flexible substrate 1 which can be a polymer foil comprising a polyimide layer or polyethylene terephthalate or a different suitable plastic layer or a metal foil covered with an insulator coating. The flexible substrate 1 may have a thickness of about 50 µm.

On a front surface F of the flexible substrate 1 the photovoltaic layer stack 3 is placed. The photovoltaic layer stack comprises a bottom electrode layer 5 that is arranged on the plastic layer or insulating coating layer. The bottom electrode layer 5 typically consist of molybdenum.

On top of the bottom electrode layer 5, a barrier layer 7 of $MoSe_2$ can be present that forms an interfacial layer with the CIGS photovoltaic active layer 9 that is stacked on the barrier layer 7. On the surface of the CIGS layer facing away from the substrate, a top electrode layer stack 11 is arranged which comprises an $Al:ZnO_2$ layer 13 and a $ZnO_2$ layer 15. A junction layer 17 of CdS (Cadmium sulfide) may be used between the photo-voltaic active layer 9 and the top electrode layer 13, 15. The $ZnO_2$ layer is adjacent to the CdS layer, and the $Al:ZnO_2$ layer is adjacent to the $ZnO_2$ layer.

It will be appreciated by the skilled in the art that the photovoltaic layer stack on the substrate can comprise a plurality of photovoltaic cells by patterning the photovoltaic layer stack with insulating line structures and conductive line structures, using for example well-known P1, P2, and P3 scribes (not shown) that can be filled with insulating material or conductive material.

The present invention provides a method to create a layout of the photovoltaic cell sheet according to a predetermined shape or contour.

Figure 2:
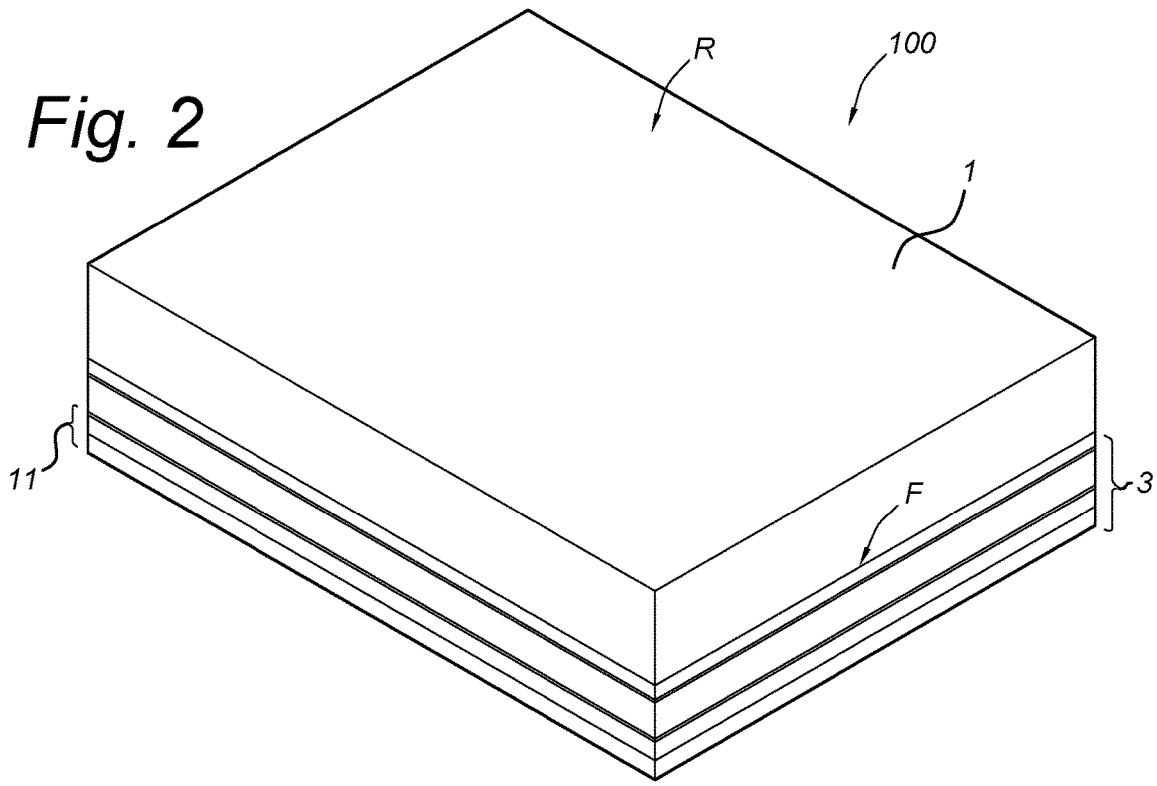
FIG. 2 schematically shows a further perspective view of the photovoltaic cell sheet.

FIG. 2 schematically shows a further perspective view of the photovoltaic cell sheet 100.

In FIG. 2 the photovoltaic cell sheet 100 is seen from the rear surface R of the substrate 1.

According to the method of the invention, the rear surface is oriented in such a way that the rear surface can be exposed to a laser beam 40 generated by a laser device (not shown).

Figure 3:
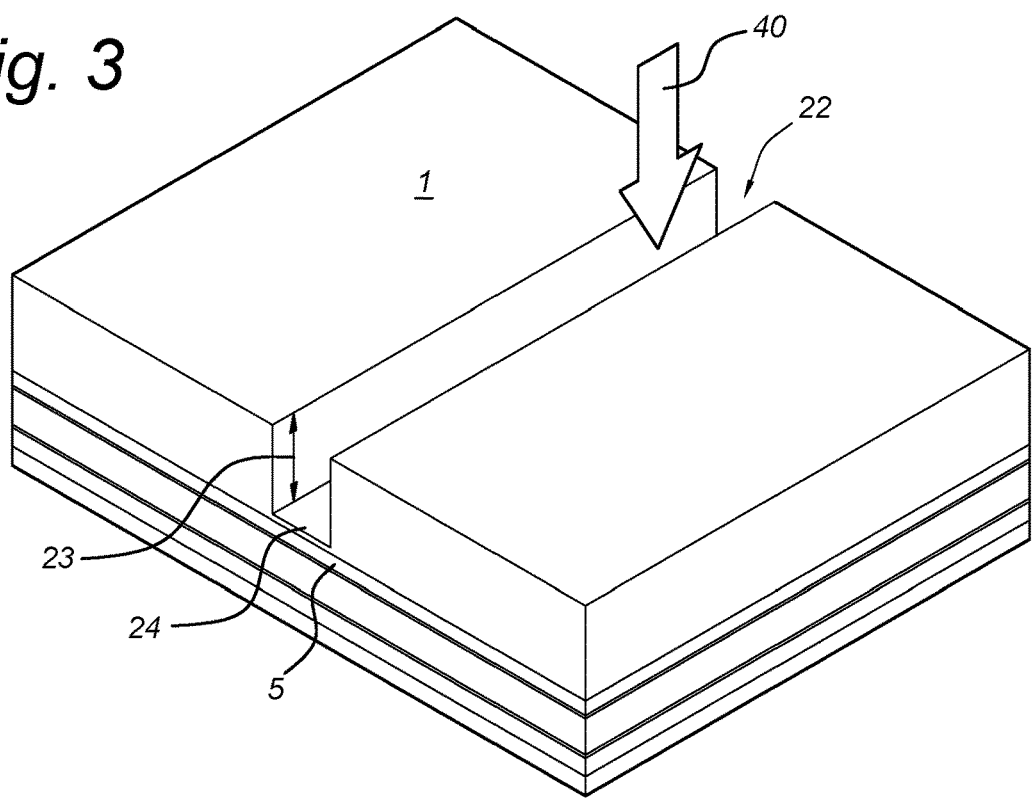
FIG. 3 schematically shows the photovoltaic cell sheet after a first step in accordance with a method of the invention.

FIG. 3 schematically shows the photovoltaic cell sheet after a first step in accordance with a method of the invention.

In a subsequent step after orienting the rear surface with respect to the laser beam, the laser beam 40 is used to create a pattern of one or more trenches 22 in the rear surface R of the photovoltaic cell sheet.

The pattern of trenches is configured as a contour that corresponds with the layout that is created.

In an embodiment, the laser beam 40 to create the pattern of trenches is a pulsed laser beam, using visible light of about 532 nm (green), for example a femtosecond laser pulse beam. Use of continuous lasers and/or wavelengths other than 532 nm including visible or IR or UV wavelengths, however, is conceivable within this invention. A pulse intensity of the laser beam may be varied from relatively high at the level of the rear surface of the substrate to relatively lower values during the trench creation process to avoid cutting of the bottom electrode layer under the substrate.

To create the pattern of trenches, the laser device is equipped with optical means or mechanical means to allow controlling a position of the laser beam relative to the rear surface R of the substrate 1.

Optical means may comprise an arrangement of mirrors and lenses to enable scanning with a laser beam spot across the rear surface R. Mechanical means may comprise a translation table for adapting the relative position of the laser beam spot on the rear surface of the substrate.

Furthermore, the method involves that the rear surface of the substrate 1 is exposed to the laser beam 40 in such a manner that the trenches 22 have a predetermined depth 23 less than the thickness of the substrate thus leaving a thin covering layer 24 of substrate material on the bottom electrode layer 5. In this manner the laser beam does not create an opening to the bottom electrode layer 5 and external influence to the bottom electrode layer is prevented.

In an embodiment, the process to create the trenches 22 involves that the predetermined depth 23 of the trenches is at least 90% of the thickness of the substrate 1.

In a further embodiment, the process to create the trenches 22 involves that the predetermined depth 23 of the trenches is between 90% and 99% of the thickness of the substrate 1.

To assist in the controlling of the predetermined trench depth, the laser device may be equipped with adjustable optics (not shown) for adapting the focus of the laser beam during the creation of the trenches.

Figure 4:
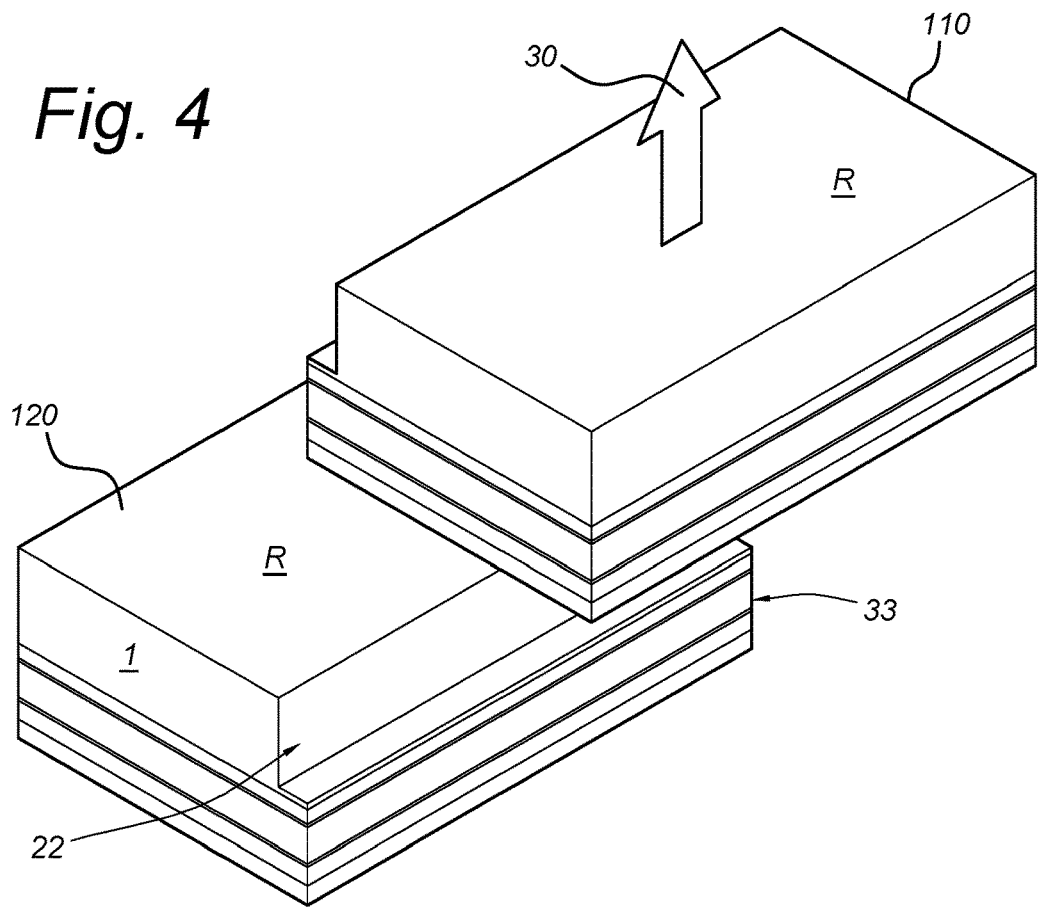
FIG. 4 schematically shows the photovoltaic cell sheet during a subsequent step in accordance with a method of the invention, and FIG. 5 schematically shows a top view of a layout of a photovoltaic cell sheet created in accordance with a method of the invention.

FIG. 4 schematically shows the photovoltaic cell sheet 100 during a subsequent step in accordance with a method of the invention.

In a next step of the method, a handling tool (schematically shown as arrow 30) is affixed to a portion 110 of the rear surface R of the substrate 1, say either an outer portion of the rear surface R of the photovoltaic cell sheet outside of the predetermined contour created by the pattern of trenches or an inner portion thereof inside the predetermined contour.

After affixing, the handling tool 30 is displaced upwards relative to the original level of the rear surface. As a result, each trench 22 defined as part of the predetermined contour and that is mechanically weak relative to the surrounding substrate material, is ruptured and causes an interruption 33, i.e., a fracture in the photovoltaic layer stack at the location of the (now ruptured) trench 22.

The handling tool 30 removes the portion 110 of the substrate material that is affixed to the handling tool together with the photovoltaic layer stack attached to the removed portion. The remaining portion 120 of the photovoltaic cell sheet (i.e., not removed by the handling tool) has a shape or contour in correspondence with the pattern of trenches 22 previously created by the laser beam.

Both the remaining portion 120 and the removed portion 110 can function as a photovoltaic cell module. Optionally, each of the remaining portion 120 and the removed portion 110 can be enhanced with a deposition or addition of a TCO layer to compensate for the lost conductivity caused by the removed part.

An edge of the ruptured trench 22 may still be observable as a step on each portion. Such step comprises an edge portion of the substrate protruding relative to the edge of the photovoltaic layer stack on top of the substrate. The width of the step would typically be about half or less of the width of the trench created by the laser beam. A typical width of the trench could be less than 100 µm; the width of the step could be between about 5 and 50 µm. The step remains visible after application of an encapsulation layer.

Some additional processing steps may be required to obtain a complete photovoltaic module, depending on the actual state of the photovoltaic layer stack prior to the removal of the portion of the substrate material. Additional steps may involve for example the creation of modules, the arrangement of electrode structure(s) if not yet created, encapsulation.

The handling tool 30 can be any tool that is configured to adhere to a portion 110 of the photovoltaic cell sheet and remove it.

In an embodiment the handling tool is or comprises a tape affixed to the rear surface R of either the outer portion or the inner portion.

In an alternative embodiment, the handling tool is a sticky layer roller that picks up portions 110 of the rear surface as selected.

In yet another embodiment, the handling tool is a vacuum tool that picks up portions 110 of the rear surface as selected. The vacuum tool may be equipped with a filter to capture the removed portions.

In another embodiment, the handling tool 30 is or comprises a selective tape which is affixed by means of a radiation curable adhesive to the portion 110 of the photovoltaic cell sheet to be removed. The laser beam is used to initiate the curing locally by exposing the selective tape to laser beam radiation only at positions within the area of the portion 110 that is to be removed.

Alternatively, the handling tool can comprise a web such that the portion(s) to be removed can be laser welded to the web for controlled selective removal.

Also, removal of a laser patterned portion can be performed by punching out using a stamp of corresponding shape or a stream of compressed air along the pattern of weakened trenches created by the laser beam.

It will be appreciated that in an alternative embodiment the creation of the trenches on the rear surface of the flexible substrate by the laser beam may be performed preceding the creation or deposition of the photovoltaic stack on the front surface of the flexible substrate. In such embodiment, as an option the rear surface of the flexible substrate may be arranged on a secondary carrier that acts as support during the creation or deposition of the photovoltaic stack and functions as handling tool afterwards.

Figure 5:
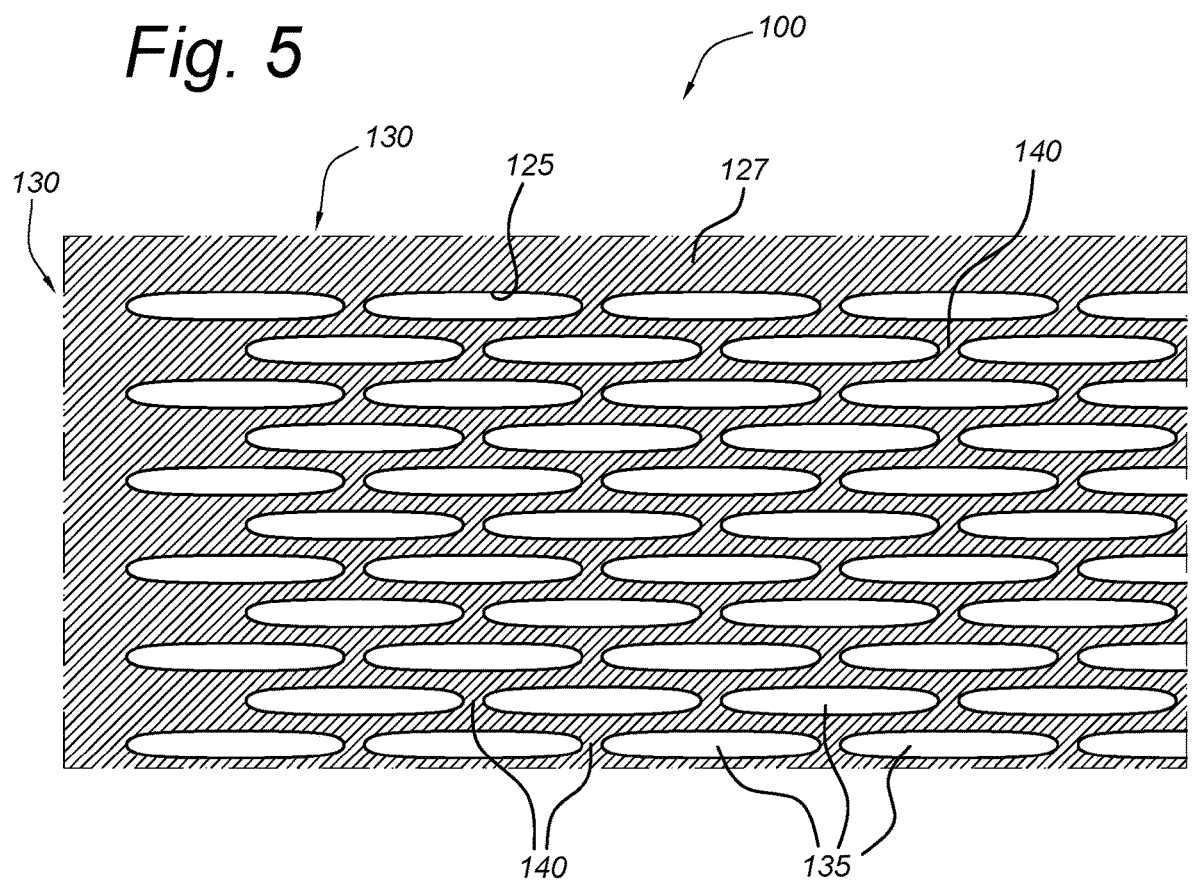

FIG. 5 schematically shows a top view of an exemplary layout of a photovoltaic cell sheet 100 created in accordance with a method of the invention.

The method according to the invention allows to create any type of contour 125 in a photovoltaic cell sheet. In the top view a dashed outline 127 is shown with indications 130 of the boundaries of a photovoltaic cell sheet 100 manufactured in a roll-to-roll process as known in the art. While the remaining portion(s) are shown as dashed areas, removed portions are indicated by open elongated areas 135.

Alternatively, elongated areas 135 can be present in form of rectangular, circular, elliptical or other (ir)regular shapes. The elongated areas 135 can be located at the boundaries of the sheet adjacent to the remaining portion(s) of the photovoltaic cell sheet but alternatively or additionally also as opening(s) within the remaining portion. If required bridging portions 140 can be provided between separate remaining portions of the photovoltaic cell sheet to create interconnect between the remaining portions and thus form a larger photovoltaic cell module.

The shape of the open areas in the photovoltaic cell sheet is only limited by the capabilities of the laser beam to generate patterns. The method allows a variety of different layouts to be created.

It will be appreciated by the skilled in the art that the present invention can also be applied in case of thin-film tandem solar cells in which two or more photovoltaic stacks are formed on top of each other and in which the photovoltaic layer in one photovoltaic stack differs from the photovoltaic layer in the other photovoltaic stacks such that the one photovoltaic stack absorbs radiation in a different wavelength range than the other photovoltaic stacks: for example a CIGS based photovoltaic stack combined with a perovskite based photovoltaic stack or a first OPV stack combined with a different second OPV stack.

In the foregoing description, the invention has been described with reference to specific embodiments thereof. It will be evident to the skilled in the art that various modifications and changes may be made without departing from the scope of the invention as summarized in the attached claims.

In addition, modifications may be made to adapt a particular structure or material to the teachings of the invention without departing from the essential scope thereof. Therefore, it is intended that the invention not be limited to the particular embodiments disclosed, but that the invention will include all embodiments and equivalents falling within the scope of the appended claims.

The invention claimed is:

1. A method for shaping a thin-film photovoltaic cell module from a photovoltaic cell sheet in accordance with a predetermined contour of the module, the photovoltaic cell sheet comprising a flexible substrate and a photovoltaic stack comprising one or more photoactive layers arranged on a front surface of the substrate, the method comprising:
providing a polymer foil or a metal foil covered with insulated coating as the flexible substrate;
creating the photovoltaic stack on the flexible substrate to form the photovoltaic cell sheet;
providing a laser source for generating a laser beam;
arranging the laser beam in such a way that the laser beam is directed towards a rear surface of the flexible substrate;
creating, by means of the laser beam, a trench in the rear surface of the flexible substrate, in which the trench is shaped according to the predetermined contour such that the photovoltaic cell sheet is divided in a first portion within the contour and a second portion outside the contour and in which the trench has a predetermined depth less than a thickness of the flexible substrate;
affixing a handling tool to the first or second portion of the photovoltaic cell sheet on the rear surface of the substrate;
rupturing the flexible substrate at the location of the trench to selectively separate the second portion from the first portion by displacing the handling tool and the affixed portion relative to the portion not affixed to the handling tool.

2. The method according to claim 1, wherein the photovoltaic stack is created on the flexible substrate to form the photovoltaic cell sheet after creating, by means of the laser beam, the trench in the rear surface of the substrate.

3. The method according to claim 1, wherein the handling tool is displaced in a direction perpendicular to the rear surface relative to the level of the rear surface of the first portion.

4. The method according to claim 1, wherein the laser beam is configured to create a trench with a depth of at least 90% of the thickness of the substrate.

5. The method according to claim 1, wherein the handling tool is a tape affixed to the rear surface of the second portion.

6. The method according to claim 1, wherein the handling tool is a sticky layer roller or a vacuum tool.

7. The method according to claim 1, wherein the handling tool is a tape selectively affixed to the second or first portion by a radiation curable adhesive, and wherein the method comprises that the laser beam irradiates and cures the selective tape at one or more locations in the second or first portion.

8. The method according to claim 5, wherein the method comprises laser welding the affixed tape to the rear surface of the second portion, by using a laser beam.

9. The method according to claim 1, wherein the creation of the trench in the rear surface of the substrate is carried out by a pulsed laser beam.

10. The method according to claim 9, wherein the method comprises that a pulse intensity of the pulsed laser beam is reduced with increasing depth of the trench.

11. The method according to claim 1, wherein the method further comprises: after separating the first and second portions, depositing a transparent conductive oxide, TCO, layer on the photovoltaic stack arranged on the first portion of the substrate.

12. The method according to claim 1, wherein the first portion comprises at least two separate portions electrically connected by a bridging portion of the photovoltaic layer stack.

13. The method according to claim 1, wherein the photovoltaic stack comprises a layer selected from CIGS, perovskite, OPV and thin-film amorphous silicon, as photovoltaic layer, or the photovoltaic stack is a tandem solar cell comprising at least two photovoltaic layer stacks each comprising a photovoltaic layer selected from CIGS, perovskite, OPV and thin-film amorphous silicon, and in which the selected photovoltaic layers are different from each other in the at least photovoltaic layer stacks.

14. A thin-film photovoltaic cell module from a photovoltaic cell sheet with a predetermined contour of the module, manufactured according to claim 1, wherein the photovoltaic cell sheet comprises a flexible substrate and a photovoltaic stack comprising one or more photoactive layers arranged on a front surface of the flexible substrate, wherein at least one edge of the thin-film photovoltaic cell module comprises a step in which an edge portion of the flexible substrate protrudes relative to an edge of the photovoltaic stack.

15. The thin-film photovoltaic cell module according to claim 14, wherein the flexible substrate is one selected from a group comprising a polymer foil or a metal foil.

* * * * *